(12) United States Patent
Partee

(10) Patent No.: US 9,207,283 B2
(45) Date of Patent: Dec. 8, 2015

(54) UNIVERSAL BATTERY CHARGER AND METHOD OF USE THEREOF

(71) Applicant: ATC Logistics & Electronics, Inc., Pittsburgh, PA (US)

(72) Inventor: Jimmie Paul Partee, Double Oak, TX (US)

(73) Assignee: ATC Logistics & Electronics, Inc., Fort Worth, TX (US)

( * ) Notice: Subject to any disclaimer, the term of this patent is extended or adjusted under 35 U.S.C. 154(b) by 320 days.

(21) Appl. No.: 13/826,611

(22) Filed: Mar. 14, 2013

(65) Prior Publication Data

US 2014/0266008 A1    Sep. 18, 2014

(51) Int. Cl.
| | |
|---|---|
| H02J 7/00 | (2006.01) |
| G01R 31/36 | (2006.01) |
| H02H 5/00 | (2006.01) |
| H01M 10/44 | (2006.01) |
| H01M 10/46 | (2006.01) |
| H01M 10/48 | (2006.01) |

(52) U.S. Cl.
CPC .............. *G01R 31/36* (2013.01); *H01M 10/441* (2013.01); *H01M 10/46* (2013.01); *H02H 5/00* (2013.01); *H02J 7/0021* (2013.01); *H02J 7/0027* (2013.01); *H02J 7/0045* (2013.01); *H02J 7/0047* (2013.01); *H01M 10/482* (2013.01); *H02J 7/0031* (2013.01); *H02J 2007/0037* (2013.01); *H02J 2007/0039* (2013.01); *H02J 2007/0049* (2013.01); *Y02B 40/90* (2013.01)

(58) Field of Classification Search
CPC ...... Y02E 60/12; H02J 7/0042; H02J 7/0045; H01M 10/46; H01M 10/44
USPC ........................................................ 320/107
See application file for complete search history.

(56) References Cited

U.S. PATENT DOCUMENTS

| | | | | |
|---|---|---|---|---|
| 5,357,185 | A * | 10/1994 | Chen ............................. | 320/110 |
| 5,365,159 | A * | 11/1994 | Chen ............................. | 320/113 |
| 5,773,961 | A * | 6/1998 | Cameron et al. .............. | 320/132 |
| 2005/0017673 | A1* | 1/2005 | Tsukamoto et al. .......... | 320/106 |

* cited by examiner

*Primary Examiner* — Arun Williams
(74) *Attorney, Agent, or Firm* — McGuireWoods LLP

(57) ABSTRACT

A system and method for charging batteries. Stops are adjusted for each of the batteries to secure the number of batteries in place. The batteries are placed to abut the stops. Adjustable contacts of the battery charger are positioned against terminals of the batteries. The batteries are secured within the receptacles of the battery charger. The batteries are charged.

20 Claims, 7 Drawing Sheets

UNIVERSAL BATTERY CHARGER AND METHOD OF USE THEREOF

BACKGROUND

The use of and development of electronics equipment has grown nearly exponentially in recent years. The growth is fueled by better electronics hardware and software available to organizations and consumers and the increased appetite for electronic devices including mobile devices. In particular, electronic and mobile devices, such as cell phones, mP3 players, e-readers, tablet devices, streaming devices, media players, medical equipment, and other similar electronic devices are being released nearly constantly. Electronic devices typically include a battery that is utilized to power the electronic device by converting chemical energy or stored energy into electrical energy utilized by the electronic device during operation.

Millions of electronic devices and their respective batteries are returned, refurbished, fixed, or otherwise processed each year. Testing and charging batteries may be difficult because of the number of devices to be processed, varying sizes and shapes, different contacts, load compatibility, and functional and non-functional characteristics (i.e., voltage and current). In some circumstances, batteries may be unnecessarily discarded increasing environmental and manufacturing waste. In other circumstances, batteries may not be fully tested or may be improperly reused or distributed.

SUMMARY

One embodiment includes a system and method for charging batteries. Stops of a battery charger may be adjusted for each of the batteries to secure the batteries in place. The batteries may be placed to abut the stops. Adjustable contacts of the battery charger may be positioned against terminals of the number of batteries. The number of batteries may be secured within the receptacles of the battery charger. The number of batteries may be charged.

Another embodiment provides a battery charger for charging a plurality of batteries. The battery charger may include a testing surface for supporting batteries. The battery charger may also include stops slidably attached to the testing surface for abutting one or more sides of the batteries. The battery charger may also include a number of adjustable contacts for electrically interfacing with the terminals of the batteries. The battery charger may also include a number of arms for securing the batteries in place. The battery charger may also include a power supply adapted to provide a current and voltage to each of the receptacles.

A battery charger for charging batteries. The battery charger may include a testing surface for supporting batteries. The battery charger may also include stops slidably attached to the testing surface for abutting the batteries. The battery charger may also include a number of adjustable contacts for electrically interfacing with the terminals of each of the plurality of batteries. The battery charger may also include a number of arms for securing the batteries in place. The battery charger may also include a power supply adapted to provide a current and voltage to each of the receptacles in a charging mode. The battery charger may also include a dynamic load configured to apply load to each of the batteries in a testing mode. The dynamic load may be configured in response to information associated with each of the batteries.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION OF THE DRAWINGS

Figure 1:
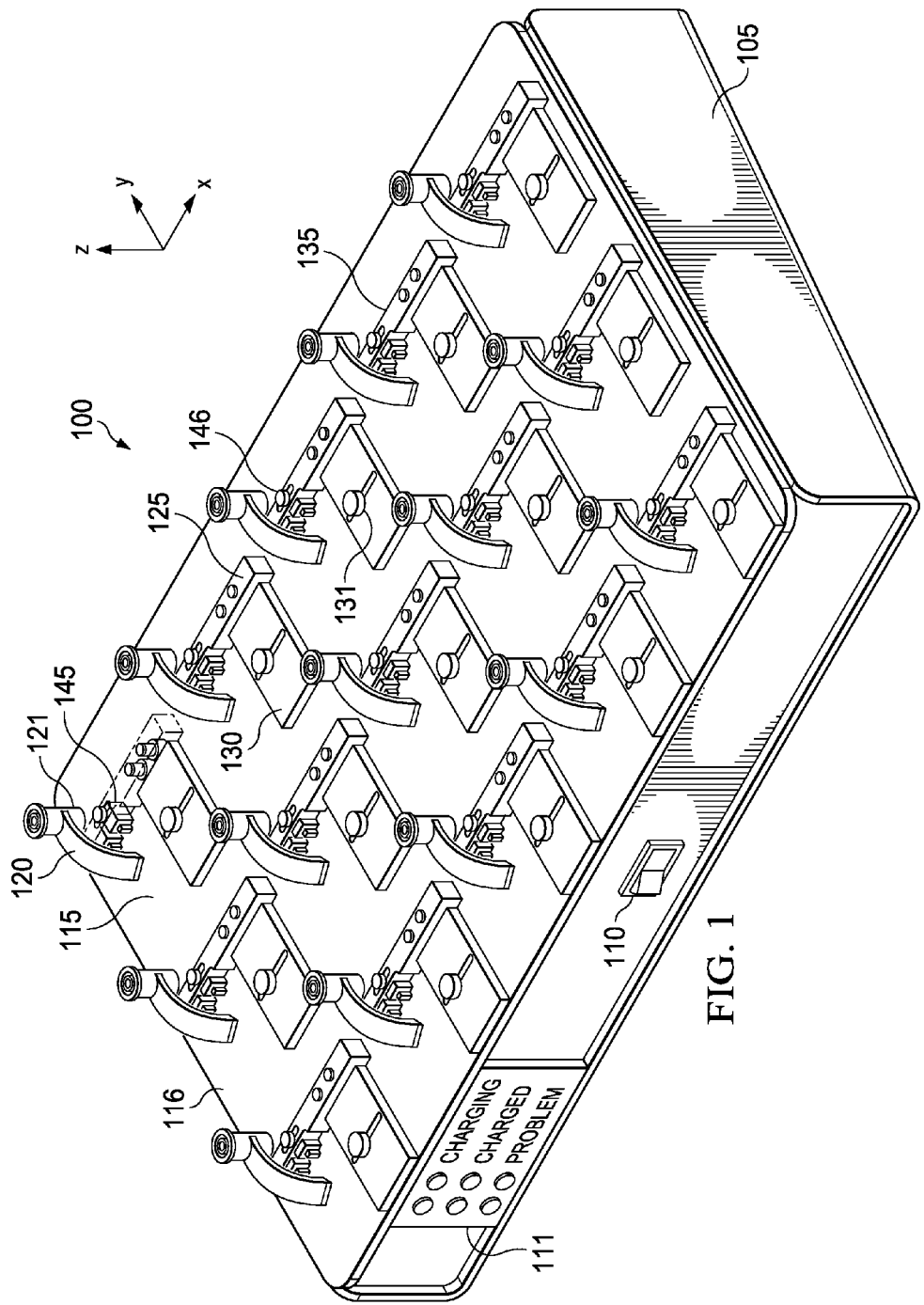
FIG. 1 is a pictorial representation of a battery charger in accordance with an illustrative embodiment.

Illustrative embodiments provide a system and method for charging and testing batteries. The term battery is utilized to generically refer to electrochemical batteries (e.g. galvanic cells, electrolytic cells, fuel cells, flow cells, voltaic piles, wet cells, dry cells), rechargeable batteries, disposable batteries, capacitors, or electronic storage components. The batteries may also be referred to as units under test (UUT). As used herein, the various embodiments, systems, and devices herein described may be referred to as battery chargers, battery testers, testing systems, or so forth. The battery charger may be utilized to charge a large number of batteries at the same time. The battery charger may also be utilized to determine functionality or non-functionality of the battery alone and its suitability for use with one or more electronic devices. For example, the battery charger may determine the capacity and functionality of each battery tested.

The battery charger is a device that may be utilized by a user to charge numerous batteries, and determine functionality or performance characteristics of a number of batteries. Functionality may be determined based on pre-set criteria or based on the charging or performance characteristics of the battery as measured during charging or simulated operational conditions. Performance characteristics may include output current, voltage, impedance, charge and discharge times, discharge curves, frame integrity, temperature, self-discharge rates, and other similar electrical characteristics of the power supply as measured when a load module is modularly connected to the power supply tester. The battery charger may be adapted to any number of sizes, shapes, and configurations of batteries. The battery charger may include logic for implementing various duty cycles or measuring cycle life of each of the batteries. Any number of discharge profiles or scenarios may be utilized to test the batteries. In one embodiment, the batteries may be charged to 80% or greater of capacity. In one embodiment, the battery charger may utilize a default voltage and current for charging a number of batteries simultaneously. For example, 4.2 V and 400 mA may be utilized as the default standards. Any number of other default standards may be set automatically or manually by the user. For example, one or more dials may be utilized to adjust the applied voltage and current. The default voltage may simplify the size and complexity of the battery charger.

The battery charger may include a number of safety measures including relays, switches, and timers utilized to ensure the safety of the user, integrity of the batteries, and continued operation of the battery charger during and after testing of the batteries. The battery charger is herein described may be scaled from a single test unit to a device configured to test 30 or more batteries at once. The battery charger may also be utilized to perform initial cycles of the batteries to ensure they are fully functional and charged and discharged in the proper way.

The illustrative embodiments may be particularly useful for wireless or rectangular batteries, such as cell phone batteries. For example, the batteries may have terminals along a single edge of the battery. The battery charger may also include any number of displays or indicators indicating the status of the batteries, battery charger, testing process, or charging process. For example, the display may include LED indicators that show whether the battery is charging, charged, the battery charger has errors, the battery has errors, there is an open/short circuit, reversed polarity, or other similar information. The battery charger may be utilized to determine which batteries may be redistributed and which batteries may need to be recycled or otherwise processed. In one embodiment, the wireless charger may utilize receptacles including adjustable contacts and stops to adjust to the different sizes of batteries. For example, the adjustable contacts may be mounted to a rail. The battery charger may be utilized be any number of manufacturers, logistics providers, large organizations, military groups, or so forth to quickly and efficiently charge, test, evaluate, and otherwise analyze batteries that may be very important for their respective businesses, activities, and endeavors.

Figure 2:
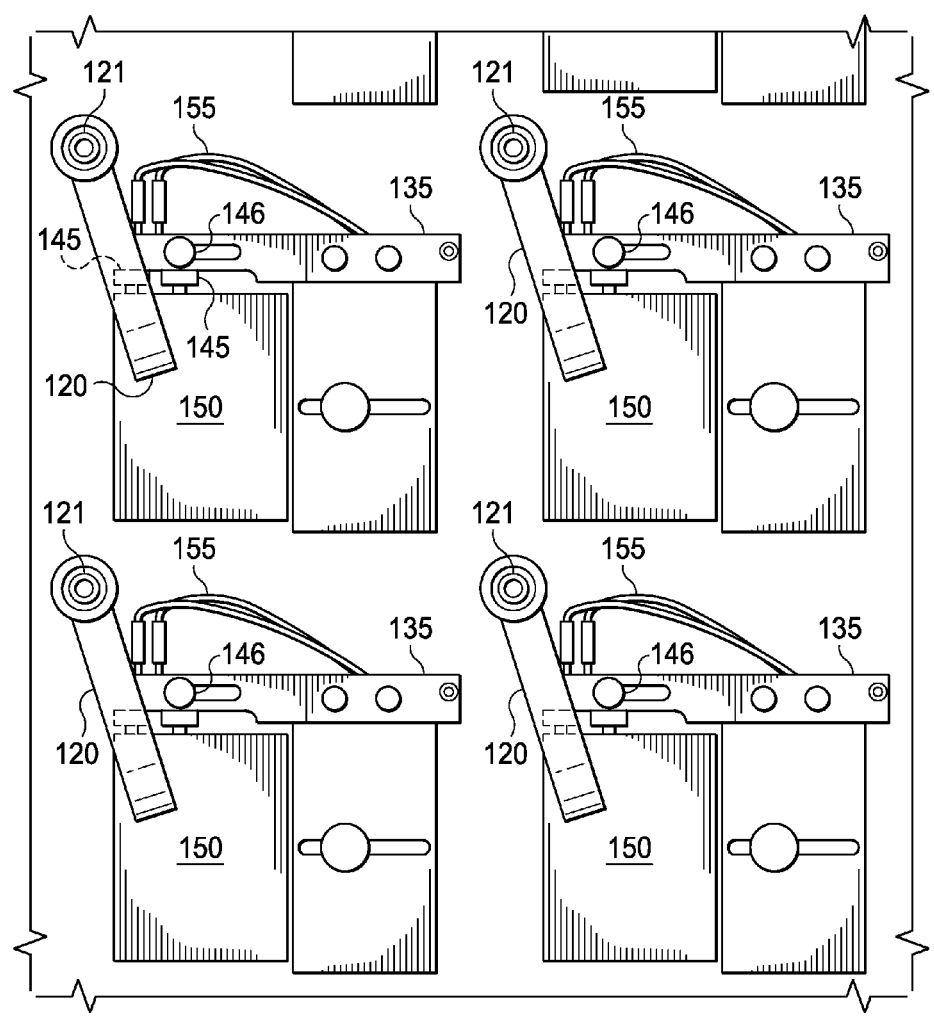
FIG. 2 is a pictorial representation of a portion of the battery charger of FIG. 1 in accordance with an illustrative embodiment.
Figure 3:
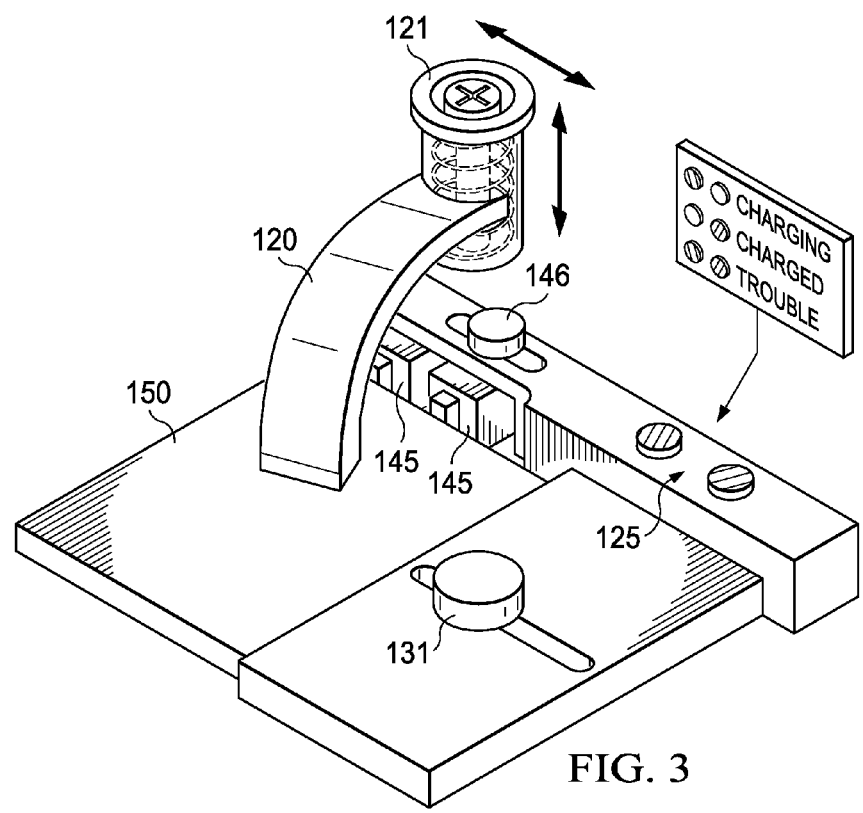
FIG. 3 is a pictorial representation of a portion of the battery charger of FIG. 1 in accordance with an illustrative embodiment.

Turning now to FIGS. 1-3, showing a pictorial representation of a battery charger 100 in accordance with an illustrative embodiment. The battery charger 100 may include any number of electrical components. The battery charger 100 may be configured in any number of shapes, sizes, and configurations. The battery charger 100 may include any number of amplifiers, filters, transformers, ports, adapters, boards, memories, processors, chips, programmable logic, and other similar components that, although not explicitly shown, may further enable the processes and functionality of the battery charger 100 as herein described. The illustrative embodiments may also utilize the systems, methods, devices or components of application Ser. No. 13/592,643 filed Aug. 23, 2012 entitled "Extended Systems and Methods for Testing Power Supplies" which claims priority to additional applications all of which are hereby incorporated by reference.

In one embodiment, the battery charger 100 may include a frame 105, a switch 110, instructions 111, an receptacle 115, securing arm 120, display 125, stops 130 and 135, 140, and adjustable contacts 145. The frame 105 is the framework that supports the components of the battery charger 100. In one embodiment, the frame 105 is a metal frame that may include one or more removable panels, covers, or so forth. For example, all or portions of the frame 105 may be removed to replace or reconfigure the components of the battery charger 100. The frame 105 may include any number of internal supports or ports for securing the different components of the battery charger 100 internally or externally. As shown, the battery charger 400 may be encompassed by plates, panels, or one or more frames or other components that house the circuits, receptacles, indicators, wires, displays, contacts, or other components of the battery charger 400. The frame 105 may include any number of insulated materials or components for protecting the user from electrical shock.

Although not shown, the battery charger 100 may include a power cord and plug for powering the battery charger 100. For example, the battery charger 100 may be powered by a standard 120 V outlet or by a specialized power supply. The switch 110 may be configured to activate power for the battery charger 100. In another embodiment, the battery charger 100 may include any number of switches corresponding to the receptacles 115.

The battery charger 100 may also be configured to be powered by alternative power devices, such as solar panels, wind turbines, fuel cells, or so forth. For example, the battery charger 100 may be particularly useful for corporations, entities, military units, remote locations, teams, groups, or other entities that may have extensive charging needs.

In one embodiment, the battery charger 100 may include instructions 111 that provide information for the user to determine whether each of the batteries is charging, charged, or there is a problem with the battery charger 100 or the battery itself. For example, the instructions 111 may inform the user how to utilize the battery charger 100 and how to evaluate the batteries during testing. In one embodiment, the instructions 111 may be printed or engraved on the frame 105. In another embodiment, the instructions 111 may be presented utilizing a display and associated graphical user interface, such as an OLED screen displaying charging and testing information for each of the batteries connected to the battery charger 100. However, the battery charger 100 may also include one or more communications ports for displaying information to an external display. The communications ports may also be utilized to manage the functionality of the battery charger utilizing a device, such as a tablet computer or laptop. The communications ports may also be utilized to communicate with their through a network and local or remote network devices, such as servers and databases.

In other embodiments, the battery charger 100 may have more complex configurations for receiving user input through a user interface (not shown), such as a touchscreen, voice commands, scroll wheels, fixed buttons, soft buttons, or so forth for dynamically configuring the battery charger 100 for testing one or more specific types of batteries. For example, the user interface may receive user input for implementing specific charging parameters, characteristics, scripts, or so forth on all or a portion of the batteries tested in the battery charger 100.

The receptacle 115 and associated components are described singularly for simplicity even though the battery charger 100 includes a number of receptacles 115. In one embodiment, the battery charger 100 is configured to test fifteen batteries at a time. However, the number of receptacles 115 included may vary between 1-100 or even more in different settings.

The receptacle 115 may be configured for batteries of any size and shape. The battery charger 100 may be particularly useful for batteries of wireless devices, such as cell phones, tablets, MP3 players, GPS devices, handheld games, media systems, or so forth. Batteries for these type of devices typically have a semi rectangular shape adapted for use with the battery charger 100. For example, the batteries may have both terminals (anode and cathode) relatively close together on a single side of the battery. The receptacles 115 of the battery charger 100 may be loaded and unloaded at any time. Each of the receptacles 115 may implement charging and testing independently. For example, charging and testing may be performed simultaneously, sequentially, concurrently or as otherwise selected by the user.

In one embodiment, the receptacle 115 supports the battery on two or more sides. For example, the stops 130 and 135 may abut and support the battery on a top side and a right side when looking from above. In other embodiments, the receptacle 115 of the battery charger 100 may include additional stops for supporting and securing the batteries. For example, multiple movable stops may be moved into position to test a particular make or model of battery. The shape of the stops 130 and 135 may vary to secure the batteries. For example, the stops may have a top lip (not shown) that sits on top of the battery for added stability. The stops 130 and 135 may also be formed of nonslip materials, such as rubber, for preventing movement of the batteries once secured.

The stops 130 may further include fasteners 131 for securing the stops 130 in place. For example, the fasteners 131 may be screwed into tighten the stops 130 to the testing surface 116. In one embodiment, the fasteners 131 may be a screw, pin, knob, biased fastener, or other connector. For example, the fasteners 131 may be screwed out or pulled up to move the stops 130 and released to secure the stops 130 back in place. As a result, the battery charger 100 may be adapted to batteries 150 of different widths.

The receptacle 115 may also include the securing arm 120. The securing arm 120 is configured to be depressed against the battery to secure the battery against the stops 130 and 135, and adjustable contacts 145 during testing. In one embodiment, the securing arm 120 is arched, curved, or otherwise biased to press the battery into a testing surface 116 of the battery charger 100. For example, the securing arm 120 may both push the battery 115 into the testing surface 116 as well as one or more of the stops 130 and 135 and adjustable contacts 145 (depending on the positioning of the securing arm 120). The securing arm 120 may be configured to rotate up to 360° for adding, positioning, and removing batteries. For example, the securing arm 120 may rotate between a stored position when the end of the securing arm 120 is outside of the receptacle 115 and a testing position when the end of the securing arm 120 is positioned on the battery or within the receptacle 150. The arched shape of the securing arm 120 may further facilitate in forcing the battery toward the adjustable contacts 145. For example, the user may press on the release 121 and simultaneously swing the securing arm 120 into position over a battery being held in place by the user. The securing arm 120 may then be pressed against the battery to hold the battery against the stops 130 and 135 as well as the adjustable contacts 145.

Although not shown, the testing surface 116 may include a number of temperature sensors that may be configured to abut or contact the batteries during testing to determine the external temperature of each of the batteries. As a result, the battery charger 100 may display or otherwise indicate if one of the more of the batteries are exceeding a temperature threshold. The temperature sensors or thermometers may also be utilized to determine if the batteries are not charging. For example, if a battery temperature has not risen to a specified minimum, the battery may be determined to be nonfunctional, have a bad connection, or not charging for whatever reason. The testing surface 116 may also include a nonslip surface, cover, or pattern that prevents batteries from sliding once positioned. The testing surface 116 may also be referred to as a base plate.

In other embodiments, the battery charger 100 may include multiple securing arms per receptacle 115. In yet another embodiment, the testing surface 116 may include multiple ports configured to receive the securing arm 120 such that the securing arm 120 may be moved or repositioned based on the needs of the user. The release 121 may be a release mechanism interconnected to the securing arm 120. In one embodiment, pushing or pulling on the release 121 may allow the securing arm 122 be lifted up or rotated for adding or removing a battery.

In another embodiment, the securing arm 120 may represent one or more clamping components. The battery charger 100 may also include a stop similar to the stop 130 on the opposite side (i.e. left side) of the receptacle 115 for further securing the battery during testing.

In one embodiment, the receptacle 115 includes the adjustable contacts 145. The adjustable contacts 145 may be connected to a power supply, interface, amplifier, or other driving components of the battery charger 100. The adjustable contacts 145 may be utilized to charge the batteries as well as perform any testing that may be required. The adjustable contacts may be connectors for electrically interfacing to or connecting to the terminals of battery. For example, most cell phone batteries may include terminals, pins, or contacts in an upper side portion of the battery. The adjustable contacts 145 may be moved into position to interface with the battery contacts or pens. As a result, a large number of different battery types, models, and configurations may be tested. For example, the battery charger 100 that is shown may be configured for testing batteries for wireless devices and 9 V batteries with adjacent terminals or terminals along a single side or edge of the battery. As shown, one or more of the adjustable contacts 145 may be adjusted in the horizontal or x-axis of the battery charger 100. The adjustable contacts 145 may also be referred to as pins.

In another embodiment, a first contact may be at a top portion of the receptacle 115 and a second contact may be at a bottom portion of the receptacle for interfacing with batteries that have separated contacts, such as AA, AAA, C, D or other similar batteries. The adjustable contacts 145 may be biased or spring-loaded to press against the battery contacts or terminals. For example, the adjustable contacts 145 may press against the terminals of the battery with the battery being held in place by the securing arm 120. The securing arm 120 may include a curved shape or extension for conforming to different shapes of batteries, such as the standard batteries described above. In another configuration, the adjustable contacts 145 may be on opposite sides of the battery and may press together to compensate for the length of the battery whatever it may be.

In one embodiment, the receptacle 115 may also include the display 125. The display 115 may include one or more lights (i.e. LEDs), screens, or communications components for indicating the status of each of the batteries, receptacle 115, or the battery charger 100 itself. For example, the display 125 may indicate whether each of the batteries is charging, charged, or there is a problem with the battery charger 100 or the battery itself. For example, a green light may indicate that the batteries charged, a red light may indicate that the battery is charging, a yellow light may indicate there is a problem with the receptacle 115 or battery charger 100, and an orange light may indicate that there is a problem with the battery, such as a short circuit, open circuit, current or voltage deviation, temperature deviation (e.g. minimum and maximum thresholds), or so forth.

In one embodiment, the display 125 may be connected to logic of the battery charger 100 that determines the status of each of the batteries. The display 125 may display solid or flashing lights to catch the attention of the user. In another embodiment, the display 125 may include any number of audio or tactile communications components for playing back instructions, status information, performance information, feedback, warnings, errors, or so forth. In another embodiment, the display 125 may indicate, the current, voltage, load, and sensed temperatures being applied to or provided by the batteries 150. In response to some test, the test parameters may change and the displays 125 may indicate the applied parameters as well as measured parameters.

FIG. 2 is a pictorial representation of a portion of the battery charger in accordance with an illustrative embodiment. The battery charger may be loaded with batteries 150 of different sizes and shapes. The securing arm 120 may be pivoted to contact any portion of the batteries 150. The release 121 may be placed at any time to release, repossession, or adjust the securing arms 120.

FIG. 2 further shows the adjustable contacts 145. In one embodiment, one or more of the adjustable contacts 145 may be moved along the stops 135 to electrically interface with the terminals of the batteries 150. In one embodiment, the adjustable contacts 145 may further include fasteners 146 for securing one or more of the adjustable contacts 145 in place. In one embodiment, only a single adjustable contact 145 and corresponding fastener 146 may be required because the other contact may typically be positioned in an upper left-hand portion of the batteries 150 as displayed. However, in another embodiment, the battery charger 100 may include two of the fasteners 146 per receptacle 115 to secure each of the adjustable contacts 145 in place. Multiple fasteners 146 for the adjustable contacts 145 may be required if battery configurations or designs change.

In one embodiment, the adjustable contacts 145 may be connected to the power system of the battery charger 100 utilizing wires 155. The wires 155 may have the polarity (cathode +, or anode –) corresponding to each of the adjustable contacts 145 for charging the batteries 150. The wires 155 may also allow the adjustable contacts 145 to be moved. For example, the wires 155 may be shielded and flexible enough to accommodate batteries 150 with differently sized and spaced contacts. In another embodiment, the wires may be integrated with or routed through the stop 135. Slidable contacts within the stops 135, frame, 105 or testing surface 116 may also allow the adjustable contacts 145 to be moved as needed while still providing the proper voltage and current to the batteries 150.

The display 125 may indicate whether the batteries 150 are successfully charging, charged, or whether there are any errors or problems with the battery charger 100 or the batteries 150 themselves. The display 125 may also be configured to display text information relating to charging or testing, such as applied voltage, applied current, detected voltage, detected current, charging time, cycle time, charge level, and other similar information.

FIG. 3 further illustrates portions of the battery charger 100. In one embodiment, the adjustable contacts 145 may include pins for electrically interfacing with the battery 150. One or both of the adjustable contacts 145 may be moved or repositioned. In the embodiment shown in FIG. 3, the positive contact may be fixed in place and the negative contact may be adjusted to interface with the negative contact of the battery 150.

In one embodiment, the adjustable contacts 145 may be spring loaded or otherwise biased toward the battery 150. The adjustable contacts 145 may also be adjustable in length to make good electrical contact with the battery 150. As a result, the adjustable contacts 145 may electrically interface with the battery 150 even with slight deviations (x, and y directions of the plane of the testing surface 116) in the position of the battery 150. For example, the adjustable contacts 146 may be pogo pins.

Figure 4:
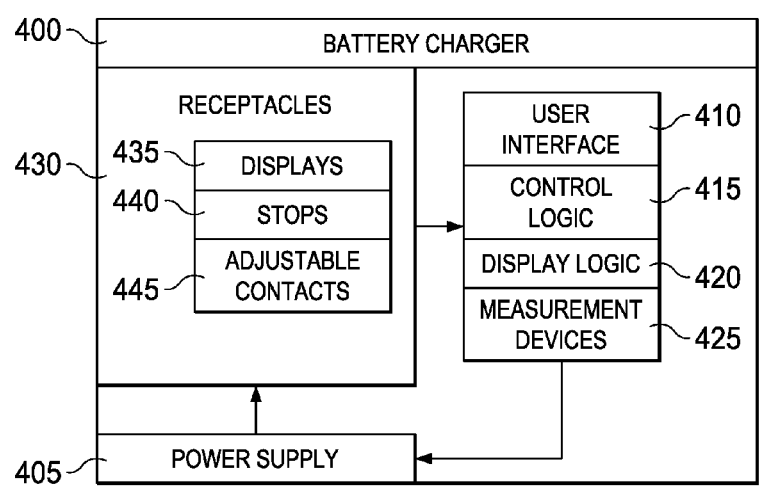
FIG. 4 is a block diagram of a charger tester in accordance with an illustrative embodiment.

FIG. 4 is a block diagram of a battery charger 400 in accordance with an illustrative embodiment. In one embodiment, the battery charger 400 may include a power supply 405, a user interface 410, control logic 415, display logic 420, measurement devices 425, and receptacles 430. The input ports 430 may further include displays 435, stops 440, and adjustable contacts 445.

In one embodiment, the battery charger 400 may be configured solely for charging batteries. In another embodiment, the battery charger may be configured for testing batteries by applying loads and monitoring the performance of the batteries. In addition, the battery charger 400 may be configured to both charge and test batteries. In one embodiment, the battery charger 400 may be configured to perform load, repetition, or fatigue tests on a number of batteries. For example, the battery charger 400 may be dynamically or modularly configured for testing the batteries.

The receptacles 430 are adapters for interfacing the batteries with the battery charger 400. As previously described, the batteries may be positioned on or within the receptacles 430 utilizing the stops 440 and the adjustable contacts 445. As previously described, the adjustable contact 445 may be configured for adjusting to different contact configurations of the batteries. In one embodiment, relays or switches may be utilized to transition between charging and testing for each of the receptacles 430. In another embodiment, all of the receptacles 430 may be configured for charging or testing at any given time.

For example, the receptacles 430 may be configured to apply a resistive load to each of the batteries connected to the battery charger 400. The load may simulate the load required to power or charge an electronic device associated with each of the batteries. The load may be configured to simulate high capacity usage, complex impedance and resistance characteristics, varying voltage and current demands, and other conditions that the batteries may experience in real-world environments.

The battery charger may also be configured to utilize a dynamic or programmable load. The loads applied may be determined based on programs, scripts, parameters, or other factors that may be received by the battery charger 400 through the user interface 410 or stored in the battery charger 400 and implemented utilizing the control logic 415. In another embodiment, the load may be set utilizing a dial, touch screen, keypad, voice command, or other communications received through the user interface 410.

In one embodiment, the user interface 410 may include one or more interfacing components for receiving user input and information. The user interface 410 may include a touchscreen, keypad, keyboard, scroll wheel, buttons, switches, mouse, or other internally or externally integrated or connected peripherals. The user interface 410 may be configured to manually or automatically receive information regarding each of the batteries. The information may include an identifier, such as a barcode, serial number, processing number, specific profile, markings, sticker, QR code, or other information may be input by a user or scanned utilizing a scanner associated with the user interface 410.

In one embodiment, the user interface 410 may include a barcode scanner, laser scanner, radio frequency identification tag reader, or imaging system for reading the information from each of the batteries. For example, the scanner may include an optical imager that utilizes optical character recognition to determine the information. In one embodiment, the user interface 410 may communicate with a wireless device linked or associated with the battery charger 400 for scanning identifying information of each of the batteries (or load modules utilized to test the batteries if applicable). The scanner may communicate with the control logic 415 to determine a charging parameter or test script utilized for each of the batteries. In one embodiment, once the battery is scanned, a particular test script may be associated with one of the receptacles 430 in response to connecting one of the adjustable contacts 445 to the associated battery. As a result, specific charging profiles may be quickly determined and implemented for the battery charger 400.

In other embodiments, the battery charger 400 may have more complex configurations for receiving user input through the user interface 410. For instance, based on information received from a user through the user interface 410, the battery charger 400 may locally retrieve or look up battery information through a network connection or database stored in memory to select the appropriate configuration and applicable charging conditions or load utilized to charge or test each of the batteries.

In one embodiment, the control logic 415 may include digital logic, such as a programmable digital-to-analog converter (DAC), that is electronically read by a processor or logic of the battery charger 400 to programmably set the voltage and current utilized to charge the batteries and the load that is applied to discharge or test the batteries. For example, the logic may specify the resistance and current drawn by the load.

In one embodiment, the receptacles 430 may be configured to supply +/−10% of the rated load. The rated load may be provided based on original equipment manufacturers (OEM) guidelines or specifications for the associated electronic devices. In one embodiment, the receptacles 430 may include a port or adapters for receiving a load that is applied to the batteries through the adjustable contacts 445. For example, a load or load module may be plugged into ports of each of the receptacles 430. For example, the ports may be ports configured to receive banana plugs. However, other types of connectors, terminals, and plugs may also be utilized. The electrical components of the battery charger 400 may include pins, traces, wires, pass, resistors, circuitry, logic, transformers, switches, relays, and other components that may be similarly utilized to connect and operate the battery charger 400.

In one embodiment, the measurement devices 425 may include a voltmeter, ammeter, ohmmeter, fault detector, and other measurement equipment. For example, a volt meter may measure the voltage across each of the adjustable contacts 445 while being tested. The ammeter may similarly measure the current through the adjustable contacts 445. In one embodiment, the battery charger 400 may include a digital display that indicates the voltage and current utilized by each battery. As previously disclosed, the digital display may also indicate whether the batteries are charging, have charged, or there are areas as well as whether the batteries have passed or failed the applicable test based on manually entered or automatically determined criteria, tolerances, or thresholds. The measurement devices 425 may include multiple voltmeters and ammeters for measuring the performance of multiple battery simultaneously. The measurements may also be stored in a database during continuous or repeated measurements.

In one embodiment, the measurement devices 425 may include one or more thermometers or thermistors within the components of the battery charger 400 for determining the temperature of each of the batteries as well as the temperature of the battery charger 400 itself. For example, thermometers may be integrated into portions of the testing surface and/or the ends of the securing arms 120 as are described in FIGS. 1-3. As a result, temperature measurements may be taken from above or below the batteries during testing.

In one embodiment, the measurement devices 425 may be integrated with the display logic 322 include indicators, such as light emitting diodes, LED screens, speakers, vibrators, or other textual displays that indicate the status of the battery charger 400 as well as each of the respective receptacles 430 and loaded batteries. The display logic 420 may function in conjunction with one or more displays to audibly, visually, or otherwise indicate information and data to a user utilizing the battery charger 400. The measurement devices 425 may include digital or analog thresholds or criteria indicating whether the batteries are charged or have passed a test. In one embodiment, the control logic 415 may indicate compliance or noncompliance of the batteries with the specified criteria. The measurement devices 425 may also utilize charging or discharging information to determine cycle discharge time, leakage, mass loss or gain, nominal energy, nominal voltage, open circuit voltage, rated capacity (i.e. ampere-hours), short circuit, or so forth.

The measurement devices 425 may also include any number of imaging systems for measuring and performing cosmetic inspections. For example, the size and shape of the batteries may be determined indicating whether there is mass losses or increases indicative of other problems. In one embodiment, the battery charger 400 may utilize any of the systems, methods, or components for visualizing the batteries that are also described for visualizing and inspecting electronic devices included in application 61/777,943 filed Mar. 12, 2013 entitled "System and Method for Automated Cosmetic Inspection" which is hereby incorporated by reference.

The measurement devices 425 may also include a timer. The timer may be a digital or analog timer the performance the charging or testing for a specific amount of time once a battery is inserted into one of the receptacles 430. However, the battery charger 400 may also be configured to automatically determine when each of the batteries is charged to turn off the power to each of the receptacles 430.

In one embodiment, the battery charger 400 is powered by the power supply model 405 that may be connected to an AC outlet (not shown). For example, the battery charger 400 may be powered by standard hundred 20 V outlet. However, the battery charger 400 may also be configured to be powered by one or more 12 V batteries, vehicles, power ports, solar generators, wind turbines or other power sources particularly for remote locations, military applications, or so forth. The power supply 405 may further include a circuit breaker acting as an automatically operated electrical switch that protects the battery charger 400 and batteries under test from damage caused by overload, excessive temperature, or short-circuit. The circuit breaker may discontinue electrical flow to or from the batteries through the receptacles 430 in response to short-circuit, failure of the batteries or receptacles 430, or battery temperatures exceeding one or thresholds.

In one embodiment, the power supply 405 may include a power switch (not shown). The power switch may be an electrical switch for electrically activating the battery charger 400. For example, the power switch may be utilized to manually activate or deactivate the battery charger 400. The power supply 405 may also include a power indicator (not shown) indicating whether the battery charger 400 is ready to perform testing. In another embodiment, the power indicator may indicate whether the battery charger is plugged into an AC power and let and/or when the power switch is been activated.

In one embodiment, the power supply 405 may also include overload protectors and a heat sink, fans, blowers, or other cooling systems for dissipating the heat of the battery charger 400 and associated batteries. Dissipating heat may be particularly important for tests that require charging and discharging the batteries one or more times within a short time.

The control logic 415 is the logic utilized to control the charging and testing of the batteries through the receptacles 430. For example, the control logic 415 may include any number of fully programmable gate arrays (FPGAs), application-specific integrated circuits (ASICs), processors, or other logic. In one embodiment, the control logic 415 may represent a computing device or communications device that interfaces with the battery charger 400. For example, the battery charger 400 may be an adapter that is controlled by an externally connected device.

In one embodiment, the battery charger 400 is an interactive device capable of interacting with the user through the user interface 410 and similarly retrieving internally or externally stored information. For example, the battery charger 400 may include a wireless transceiver, network adapter, or other similar cards, ports, interfaces, boards, or components for communicating with one or more devices or wired or wireless networks. For example, as a number of tests are performed for specific batteries, an identifier, such as the barcode, serial number, or label, may be associated with each battery and the results of the tests for the batteries may be stored in an internally or externally located database or memory. The test results may also be automatically or selectively communicated to one or more external computing or communications devices, memories, or databases for access, archival, or storage.

For example, the battery charger 400 may include a database (not shown) for storing the performance information associated with each of the tested batteries. For example, an identifier, such as a barcode, serial number, or other identifying information may be utilized to associate the performance information with the test results. The database may also include any number of testing parameters (e.g. applied load, charge time, discharge time, voltage, current, etc.), acceptable thresholds, tolerance levels, procedures, settings, preferences, scripts, programs, or other conditions associated with the battery charger 400 or batteries under test.

The database may store charging or testing profiles or configurations for a number of different battery makes, models, configurations, settings, software, or so forth. The database may also store information associated with different communications service providers, OEMs, distributors, logistics providers, or other parties that may have specific charging or testing criteria, thresholds, requirements, percentages, and instructions. The database may be updated manually through one or more ports or network interfaces or automatically through a network connection to include the most data, information, or settings from a managing device, original equipment manufacturers (OEMs), communications service providers, or so forth. For example, the database may store a program for implementing one or more duty cycles on each of the batteries. The various duty cycles may be implemented based on circumstances, such as new product testing, repairs, refurbishment, unknown status, or so forth.

Although not explicitly shown, the battery charger 400 may include a processor and a memory. For example the processor and memory may be integrated with the display logic 420. The processor may be circuitry or logic enabled to control execution of a set of instructions. The processor may be microprocessors, digital signal processors, application-specific integrated circuits (ASIC), central processing units, or other devices suitable for controlling an electronic device including one or more hardware and software elements, executing software, instructions, programs, and applications, converting and processing signals and information, and performing other related tasks. The processor may be a single chip or integrated with other computing or communications components.

The memory may be a hardware component, device, or recording media configured to store data for subsequent retrieval or access at a later time. The memory may be static or dynamic memory. The memory 3 may include a hard disk, random access memory, cache, removable media drive, mass storage, or configuration suitable as storage for data, instructions, and information. In one embodiment, the memory and processor may be integrated. The memory may use any type of volatile or non-volatile storage techniques and mediums. For example, the memory may store testing scripts that may run on one or more of the batteries simultaneously, concurrently, or in series. The testing scripts may be executed by the processor to test the functionality and performance characteristics of the batteries. In one embodiment, the battery charger 400 may have limited measurement devices 425 and as a result switching between the different receptacles 430 may be required to fully utilize the receptacles 430 at any given time.

Figure 5:
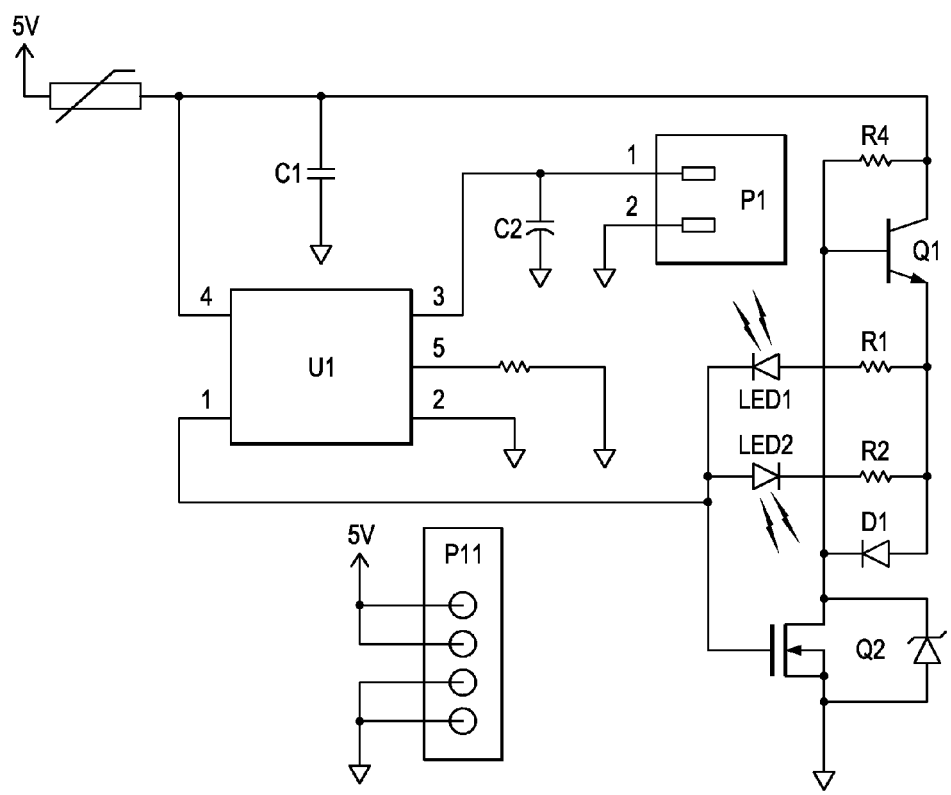
FIG. 5 is a circuit schematic of a battery charger in accordance with an illustrative embodiment.

FIG. 5 is circuit schematic of a battery charger 500 in accordance with an illustrative embodiment. The battery charger 500 is shown only as one example of a chipset configuration. The battery charger 500 may be implemented as a circuit, chipset, programmable logic, or discrete components. In one embodiment, the battery charger 500 may be powered by a 5 V power source. The battery charger may include any number of resistive systems for adjusting the current and voltage applied to the batteries. Similarly, any number of light emitting diodes may be activated when the battery is charging, charged, or has errors. The battery charger 500 may include reverse polarity protection. For example, the receptacle may be disconnected from power if reverse polarity is detected for the associated battery. The battery charger 500 may be configured to determine the charging rate.

Figure 6:
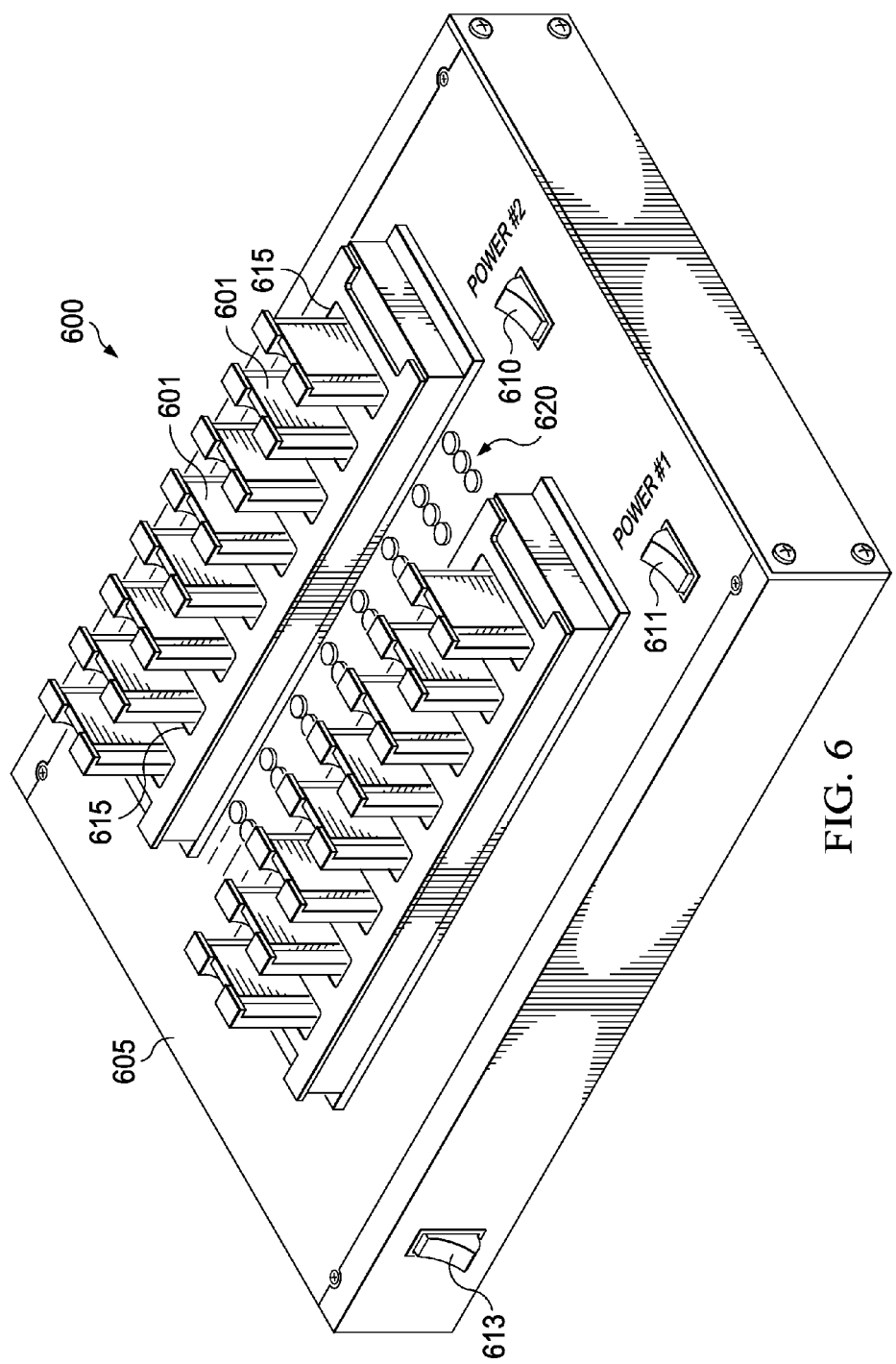
FIG. 6 is a pictorial representation of a another battery charger in accordance with an illustrative embodiment.

FIG. 6 is a pictorial representation of another battery charger 600 in accordance with an illustrative embodiment. In one embodiment, the battery charger 600 may include batteries 601 a frame 605, a switches 610, 611, 612, instructions 613, receptacles 615, and displays 620.

The battery charger 600 of FIG. 6 is configured to be loaded with the batteries 601 in a vertical position rather than the horizontal position illustrated in FIG. 1. As previously described, the batteries 600 may represent any number of different batteries. In one embodiment, the batteries 601 are configured for utilization in wireless devices, such as cell phones. For example, the batteries 601 may have terminals that are aligned on a single side of the battery.

As shown, the battery charger 600 may have groups of receptacles 615. The may also be referred to as bays or sets. In one embodiment, the switches 610 and 611 may be utilized to power on the different sets of receptacles 615. The switch 613 may be configured to power on or off the entire battery charger 600. The switch 613 may be particularly important in the event of a malfunction or error. For example, the user may then flip the switch 613 to power off all of the components of the battery charger 600. Although not specifically shown, the receptacles 615 may similarly include adjustable contacts. In one embodiment, the adjustable contacts may be adjusted through the openings of the receptacles 615. For example, a tool, such as a screwdriver or stylus may be utilized to position the adjustable contacts within the receptacles 615. In another embodiment, the adjustable contacts may include one or more adjustment mechanisms, such as knobs, pins, or dials for adjusting the position of the adjustable contacts. For example, by turning a knob associated with each of the receptacles 615, the user may adjust the positioning of the adjustable contacts to correspond to the terminals of each of the batteries. In another embodiment, the adjustable contacts may be adjusted from a backside of the battery charger 600.

The width and depth of the receptacles 615 may be configured for receiving batteries of many different sizes and shapes. In one embodiment, the battery charger 600 may include an arm, or locking mechanism for securing the batteries 601 in place during charging or testing.

Figure 7:
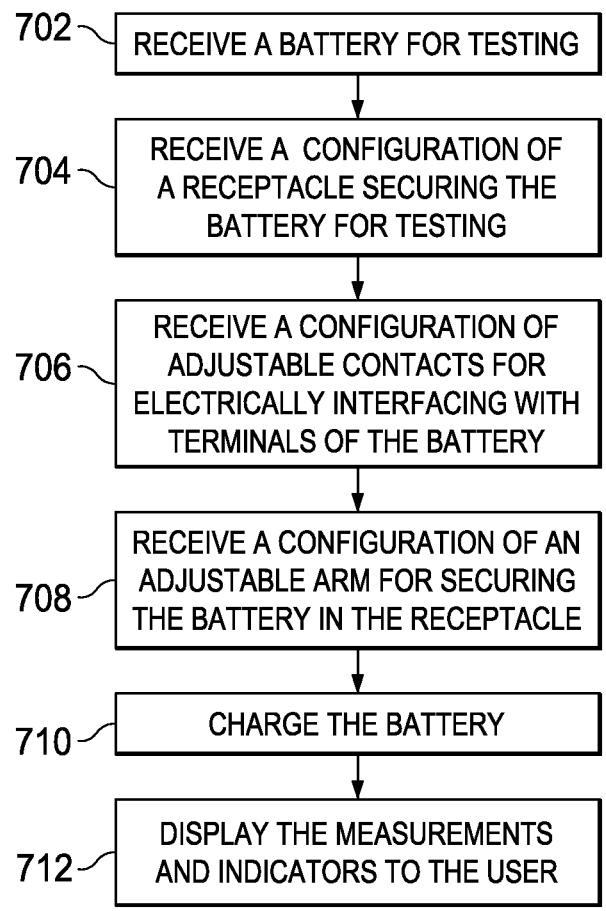
FIG. 7 is a flowchart of a process for charging a battery in accordance with an illustrative embodiment.

FIG. 7 is a flowchart of a process for charging a battery in accordance with an illustrative embodiment. In one embodiment, the process of FIG. 7 may be implemented by a battery charger. The process may be performed for a single battery at a time or a number of batteries. In one embodiment, the battery charger may be particularly suited for charging cell phone batteries, square or rectangularly shaped battery packs, or batteries with terminals that are close to one another. The steps of the process of FIG. 7 may be performed in any order based on the preferences of the user or policies of an applicable organization.

In one embodiment, the process may begin with the battery charger receiving a battery for testing (step 702). In one embodiment, the battery may be placed on a testing surface of the battery charger. The battery charger may be configured to charge any number of batteries. For example, the battery charger may utilize a default voltage of between 3.7 V to 4.3 V to charge the batteries. Similarly a default current of 50 mA to 1000 mA may be utilized to charge the batteries with a current 400 mA being the most commonly used current.

In another embodiment, the battery charger may include a scanner or user interface for receiving or identifying the battery and associated information. For example, a barcode, serial number, or other information may be utilized to determine the capacity of the battery as well as a current and voltage utilized to charge the battery. The user may also manually enter information is determined based on the manufacturer, battery label, or so forth for performing the charging.

Next, a receptacle is configured to secure the battery for testing (step 704). During step 704, one or more stops may be configured to abut the battery on one or more sides. For example, the battery charger may include a fix to stop along a top portion of the receptacle and a side stop that may be adjusted to the width of the battery.

Next, the battery charger receives the configuration of adjustable contacts for electrically interfacing with terminals of the battery (step 706). In one embodiment, the adjustable contacts may be positioned along a top portion of the receptacle. The adjustable contacts may be adjusted in an x-axis or horizontal line for making contact with the terminals. The adjustable contacts may include a fastener for securing one or more of the adjustable contacts in place. In one embodiment, the adjustable contacts include a first contact fixed in place and a second contact that may be moved horizontally along the top of the receptacle. In one embodiment, the top of the receptacle is a fixed stop as is herein described. The adjustable contacts may also be biased or configured to extend toward the battery when positioned within the receptacle.

Next, the battery charger receives the configuration of an adjustable arm (step 708). In one embodiment, the adjustable arm may be configured to provide a downward force (z axis) on the battery as well as a stabilizing hold on the battery for the X and Y axis of the testing surface. The adjustable arm may also apply a force against the battery to ensure a proper electrical connection with the adjustable contacts. In one embodiment, the adjustable arm is biased such that a user input is required to move or position the adjustable arm. For example, a pushing or pulling force may be required to be applied to the adjustable arm to rotate it from a stored position to a testing position.

Next, the battery charger charges the battery (step 710). During step 710 the battery charger may charge the battery utilizing the default voltage and current, such as 4.2 V at 400 mA. The default voltage may be uniformly applicable to a number of batteries thereby reducing the complexity of the battery charger and ensuring smooth operation. In one embodiment, each of the receptacles of the battery charger may be powered on automatically, manually, or after a time. In response to the adjustable contacts being positioned against the terminals of the battery. For example, the battery may begin to be charged automatically once the battery is placed in contact with the adjustable contacts. In another example, the battery may be charged in response to a user selection of a switch or other input. The battery may also begin to charge 20 seconds after the adjustable contacts are electrically interfaced with the terminals of the battery. As previously described, the battery information may also be utilized to determine the custom voltage and current applied to the battery.

In one embodiment, the battery may be charged to a predefined level, such as 90% of the capacity. In another embodiment, the battery charger may be configured to charge the battery for a specified time period, such as 1.5 hours. For example, the battery charger may deactivate power to each of the receptacles in response to determining the associated batteries are fully charged or have met the specified thresholds.

Next, the battery charger displays measurements and indicators to the user (step 712). The battery charger may include a number of LEDs for displaying the status of the battery charging. For example, the battery charger may indicate whether the battery is charging, charged, or there are errors with the battery itself or the battery charger. Errors may include no current being drawn by the receptacle and associated battery, a short circuit, reversed polarity of the terminals and adjustable contacts, or excessive heat detected for each of the batteries or the battery charger itself. The measurements and indicators may also indicate whether the battery charger and each of the batteries are functional or nonfunctional.

In one embodiment, as soon as the battery is electrically interfaced with the adjustable contacts, the battery charger may begin to take measurements of the battery as well as display the current and voltage applied to the battery.

Figure 8:
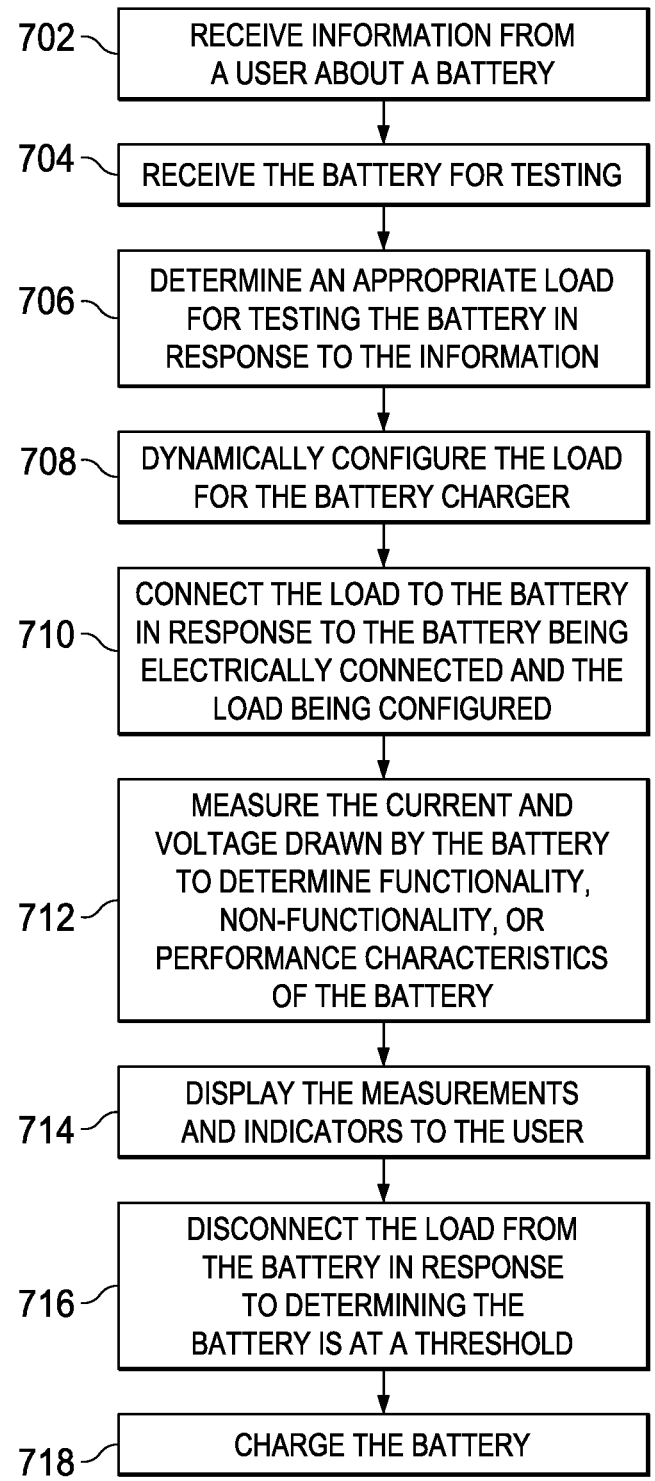
FIG. 8 is a flowchart of a process for testing a battery in accordance with an illustrative embodiment.

FIG. 8 is a flowchart of a process for testing a battery in accordance with an illustrative embodiment. The process of FIG. 8 may be implemented by a battery charger/tester based on interaction with a user to test one or more batteries. In one embodiment, the process of FIG. 8 may be performed after performing charging as was previously described. In another embodiment, a determination of whether the battery is charged may be performed during the process of FIG. 8, such as step 704.

The process may begin by receiving information from a user about a battery (step 802). The information may include functional parameters for the battery, such as make, model, manufacturing date, applicable standards, location of manufacture, capacity, internal resistance, self-discharge, approximate cycles, shelf life, temperature thresholds, voltage thresholds, current thresholds, or other information associated with the battery. In one embodiment, the battery tester may include a scanner or imaging system for automatically determining information associated with the battery. For example, in response to scanning a barcode associated with the battery, the relevant information including testing information may be retrieved.

Next, the battery tester receives the battery for testing (step 804). In one embodiment, the battery may be received in a receptacle of the battery tester. During step 804, the receptacle may be configured to receive the specific make and model of the battery. For example, one or more stops may be adjusted to abut sides or edges of the battery. The adjustable contacts may also be configured to electrically interface with the terminals of the battery.

Next, the battery tester determines an appropriate load for testing the battery in response to the information (step 806). For example, particular brands of battery testers may require a specified resistive load to simulate the load required to power communications, computing, or other electronic devices. The load may also be varied during testing to ensure functionality at minimum to maximum load parameters.

Next, the battery tester dynamically configures the load of the battery tester (step 808). For example, variable resistors may be automatically configured to discharge the battery. In one embodiment, a test script may specify the load and discharge settings. The battery tester may also set fixed or variable testing parameters and how the test results are recorded.

Next, the battery tester connects the load to the battery in response to the battery being electrically connected and the load being configured (step 810). For example, during step 810 the actual testing of the battery may be initiated.

The battery tester measures the current and voltage by the battery to determine functionality, non-functionality, and performance characteristics of the battery (step 812). The measurements may be performed by any number of measurement devices connected to the receptacles and associated batteries. For example, the determinations of functionality, non-functionality, and performance characteristics may be determined based on testing or measurements scripts or programs executed by the battery tester.

Next, the battery tester displays the measurements and indicators to the user (step 814). The measurements and indicators may also be stored and/or communicated to an external device.

The battery tester disconnects the load from the battery in response to determining the battery is at a threshold (step 816). In one embodiment, the threshold is determined based on the type, make, and model of the battery. For example, some batteries should never be discharged below 5%. Any number of criteria are thresholds may be set to safely test the batteries without damage to the batteries themselves or the battery tester.

In another embodiment, a time period may be utilized to perform the testing. The time period may be determined electronically or mechanically. In one embodiment, a digital or analog timer may be utilized. The timer may disconnect power to the battery after a period of 10-20 minutes as set by testing parameters or a user. The battery tester may also be configured to disconnect the batteries from the load (or from charging) in response to the battery, battery tester, or electrical components reaching a certain point or overheating due to excessive current.

As previously described, any number of batteries may be charged or tested simultaneously. The battery charger may be configured to charge and test numerous batteries at one time. The battery charger may also be configured to support batched charging or testing of batteries. As a result, the user's time and battery charger may be utilized more efficiently. The battery charger provides the benefit of both charging and testing a large number of batteries at one time while most efficiently utilizing the resources that make up the battery charger. As a result, materials, time, and expenses are saved benefiting individuals, companies, organizations, and the environment.

The previous detailed description is of a small number of embodiments for implementing the invention and is not intended to be limiting in scope. The following claims set forth a number of the embodiments of the invention disclosed with greater particularity.

What is claimed:

1. A method for charging batteries, comprising:
adjusting stops of a battery charger for each of a plurality of batteries to secure the plurality of batteries in place;
placing each of the plurality of batteries to abut the stops;
positioning adjustable contacts of the battery charger against terminals of the plurality of batteries;
securing the plurality of batteries within receptacles of the battery charger utilizing a plurality of arms that are arched and pivotally mounted to a testing surface for swinging the plurality of arms into a testing position and a storage position for each of the plurality of batteries; and
charging the plurality of batteries.

2. The method according to claim 1, wherein the adjustable contacts include a fixed contact and a slidable contact.

3. The method according to claim 1, wherein the plurality of batteries are placed against the testing surface including a plurality of receptacles including the stop and the adjustable contacts for the plurality of batteries.

4. The method according to claim 1, further comprising:
displaying an indicator indicating whether each of the plurality of batteries are charging, charged, or have errors.

5. The method according to claim 1, further comprising:
measuring charging characteristics of the plurality of batteries including at least voltage and current.

6. The method according to claim 5, wherein the charging characteristics further include a temperature.

7. The method according to claim 1, further comprising:
fastening the stops and the adjustable contacts in place utilizing a fastener.

8. The method according to claim 1, wherein the stops abut against a side of each of the plurality of batteries, and wherein a fixed stop abuts a top portion of each of the plurality of batteries.

9. The method according to claim 1, further comprising:
discharging the plurality of batteries according to discharge criteria to test a status and capacity of each of the plurality of batteries.

10. A battery charger for charging a plurality of batteries, comprising:
a testing surface for supporting a plurality of batteries;
stops slidably attached to the testing surface for abutting one or more sides of the plurality of batteries;
a plurality of adjustable contacts for electrically interfacing with the terminals of the plurality of batteries;
a plurality of arms that are arched and pivotally mounted to the testing surface for swinging the plurality of arms into a testing position and a storage position for securing the plurality of batteries in place; and
a power supply adapted to provide a current and voltage to each of the receptacles.

11. The battery charger according to claim 10, wherein the plurality of batteries are cell phone batteries.

12. The battery charger according to claim 10, wherein the adjustable contacts are horizontally adjustable.

13. The battery charger according to claim 10, wherein the stops and the plurality of adjustable contacts include fasteners for being secured in place against the testing surface.

14. The battery charger according to claim 10, further comprising:
    measurement devices for measuring a status and a capacity of the plurality of batteries.

15. The battery charger according to claim 10, further comprising:
    one or more loads configured to be applied to the plurality of batteries for discharging the plurality of batteries to perform testing.

16. The battery charger according to claim 10, wherein the plurality of batteries are charged utilizing a standard voltage and current.

17. A battery charger for charging a plurality of batteries, comprising:
    a testing surface for supporting a plurality of batteries;
    stops slidably attached to the testing surface for abutting the plurality of batteries;
    a plurality of adjustable contacts for electrically interfacing with the terminals of each of the plurality of batteries;
    a plurality of arms that are arched and pivotally mounted to the testing surface for swinging the plurality of arms into a testing position and a storage position for securing the plurality of batteries in place;
    a power supply adapted to provide a current and voltage to each of the receptacles in a charging mode; and
    a dynamic load configured to apply a load to each of the plurality of batteries in a testing mode, wherein the dynamic load is configured in response to information associated with each of the plurality of batteries.

18. The battery charger according to claim 17, further comprising:
    measurement devices for measuring a status and a capacity of the plurality of batteries.

19. The battery charger according to claim 17, wherein the information is entered by a user.

20. The battery charger according to claim 17, wherein the information is automatically determined in response to scanning an identifier associated with each of the plurality of batteries utilizing a scanner integrated with the battery charger.

* * * * *